(12) United States Patent
Yang (10) Patent No.: US 10,295,887 B2
(45) Date of Patent: May 21, 2019

(54) LOW-GLARE FLUORESCENT-POWDER LED LIGHT DEVICE AND IMAGING DEVICE COMPRISING THE SAME

(71) Applicant: AgieMinds Micro Optics Co., Ltd., New Taipei (TW)

(72) Inventor: Chih-Yi Yang, Taipei (TW)

(73) Assignee: Agieminds Micro Optics Co., Ltd., New Taipei (TW)

( * ) Notice: Subject to any disclaimer, the term of this patent is extended or adjusted under 35 U.S.C. 154(b) by 0 days.

(21) Appl. No.: 15/878,093

(22) Filed: Jan. 23, 2018

(65) Prior Publication Data

US 2018/0210319 A1    Jul. 26, 2018

(30) Foreign Application Priority Data

Jan. 26, 2017   (CN) .......................... 2017 1 0061758

(51) Int. Cl.
  *G03B 15/02*   (2006.01)
  *H01L 33/50*   (2010.01)

(52) U.S. Cl.
  CPC ........ *G03B 15/02* (2013.01); *G03B 2215/056* (2013.01); *G03B 2215/0539* (2013.01); *G03B 2215/0567* (2013.01); *G03B 2215/0571* (2013.01); *G03B 2215/0575* (2013.01); *H01L 33/502* (2013.01)

(58) Field of Classification Search
  CPC ............ G03B 15/05; G03B 2215/0539; G03B 2215/0567
  USPC ...................................................... 362/3–18
  See application file for complete search history.

(56) References Cited

U.S. PATENT DOCUMENTS

2012/0243860 A1*  9/2012  Yang ...................... G03B 15/05
                                                        396/199

* cited by examiner

*Primary Examiner* — William J Carter
(74) *Attorney, Agent, or Firm* — Wang Law Firm, Inc.

(57) ABSTRACT

A low-glare fluorescent-powder LED light device includes a shell, a multi-frequency directional light source, a high-frequency directional light source, and an electrical control circuit. The shell has a surrounding wall, which defines a front opening and a rear opening and has an inner surface extending along a central axis. The multi-frequency directional light source, including at least one fluorescent-powder LED, is disposed at the inner surface of the shell. The high-frequency directional light source, including a plurality of high-frequency LEDs, is disposed at the inner surface of the shell such that the high-frequency LEDs are arranged in radial symmetry about the central axis. The electrical control circuit can drive the multi-frequency directional light source and/or the high-frequency directional light source. The central light beams emitting from the high-frequency LEDs do not reach the fluorescent-powder LED, so that the fluorescence interference of the fluorescent-powder LED can be avoided.

6 Claims, 13 Drawing Sheets

LOW-GLARE FLUORESCENT-POWDER LED LIGHT DEVICE AND IMAGING DEVICE COMPRISING THE SAME

FIELD OF THE INVENTION

The present invention relates to a low-glare fluorescent-powder LED light device and an imaging device comprising the LED light device.

BACKGROUND OF THE INVENTION

Earlier light-emitting diodes (LEDs) are mostly monochromatic LEDs. The light emission of an LED is due to electrons falling to a lower energy level. If a proper energy difference is not available, an ideal LED light source cannot be produced. Thus, earlier technology requires red, blue, and green chips to be assembled together to form a single white LED component. For this reason, the earlier white LEDs are also called multi-chip white LEDs.

Since Nichia Corporation disclosed a phosphor-LED device, which is a light-emitting diode covered with a layer of phosphor or fluorescent powder, more and more applications of LEDs has been developed. For example, a blue LED chip emits blue light passing through a material containing phosphors which fluoresce in yellow; the original blue light and the fluoresced yellow light recombine to form a blended light beam. The color vision of human eyes is based on tree kinds of cone cells, which respectively correspond to perception of red, green, and blue light. Because the yellow fluorescence can stimulate and activate the cone cells associated with red and green light, and the original blue light can stimulate the cone cell associated with blue light, white light can be perceived by the human eyes.

The white light, which is produced by a blue LED chip in cooperation with yellow YAG (Yttrium Aluminum Garnet) phosphor or in cooperation with red and green phosphors, is commonly used in the industry today. Since this type of light source, especially the blue LED chip with the YAG, has a lower cost and the circuit design is simple, it is applied extensively. However, the color rendering of this light source is not good. Some researchers hold an opinion that the future development trend of white LEDs is towards the UV LED (ultraviolet LED) cooperated with red, green, and blue phosphors. Compared with incandescent light bulbs, white LEDs have the advantages of high conversion efficiency, short activation time, long service life and the like. Thus, the phosphor-LED device has been widely used in artificial lighting.

On the other end, monochromatic light sources can serve as an illumination device applied in many fields, such as criminal identification, counterfeit identification, metal aging test, transgenic detection, and fundus examination. Those identification equipment employ monochromatic light as excitation light or illumination light, which can be used to detect physiological fluids, such as blood or semen, or directed at a banknote to reveal the security features thereon, or directed at a metal material to detect the fluorescent coating which has not been erased in the aging lines of the metallic material, or directed at an organism to detect the presence of a fluorescent protein to confirm whether a transgene is successfully introduced to the organism or not.

Most of the illumination devices of the aforementioned identification equipment are required to provide white light illumination. For example, in a forensic examination, investigators should rely on white light image records to conduct cross comparison to confirm the relationship between evidence and the environment to persuade judges or juries of the truth of the evidence. In addition, some identification equipment employs UV light as an excitation light, which cannot be directly observed with human eyes; however, for conducting a proper operation of the equipment, investigators should rely on white light illumination. The applicant of this application has developed some light sources, in which various light emitting elements are employed. Among those light sources, a composite light source may be a combination of a UV LED and a white LED, or a combination of a blue LED and a white LED, or a combination of an infrared LED and a phosphor LED.

For criminal identification, metallic material test, and biological research, it is important that the color distribution and sharpness of an image is not allowed to have little deviation. Particularly, in the case of the image record formed by weak fluorescence, unwanted light should be reduced, and a suitable light source should be selected so that direct reflection from an object to be tested can be reduced to prevent the light beams of direct reflection from entering an imaging device to interfere with an image record. Generally, a low-angle annular light source can be employed to achieve the effect of dark-field illumination and to create scattering to prevent the image of the object from interference.

Figure 14:
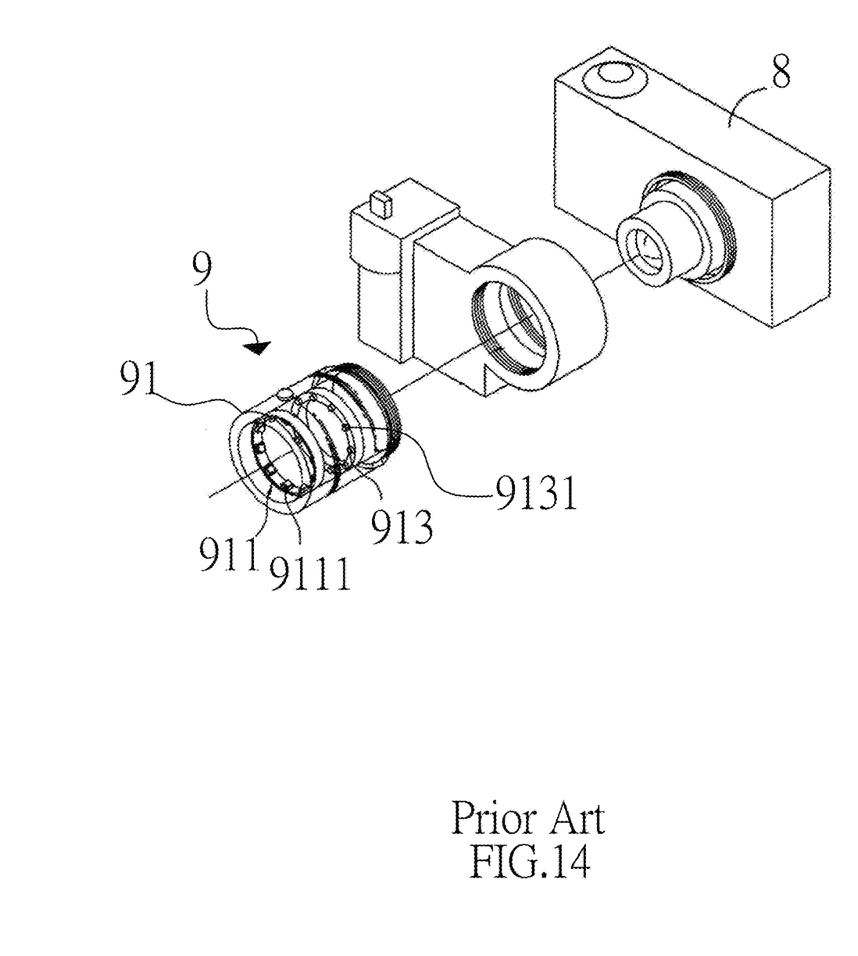
FIG. 14 shows a schematic view of a prior art.

FIG. 14 shows a conventional device, wherein a light source thereof is in the form of a ring. As shown, the illuminating device 9 includes a cylinder 91, which can be connected with a camera 8 by a battery block. The cylinder 91 is provided with a first light-emitting unit 911 and a second light-emitting unit 913. The first light-emitting unit 911 includes a plurality of high-frequency LEDs 9111. The second light-emitting unit 913 includes a plurality of white LEDs 9131 each containing a yellow phosphor coating. A user can select one of the light-emitting units to be turned on according to an application.

In the conventional device, when the high-frequency LEDs 9111 are enabled to emit UV light, since the white LEDs 9131 are within the illuminating range of the high-frequency LEDs 9111 or on the light-emitting axis or path of the high-frequency LEDs 9111, the yellow phosphor coatings of the white LEDs 9131 can absorb part of the UV light to release yellow fluorescence, which may affect the image of a target under the UV light. Thus, the signal/noise ratio can be reduced significantly, and thus the image may be misinterpreted. Particularly, when the yellow fluorescence released by the target is similar to the yellow fluorescence emitted by the white LEDs 9131, the image formed by the yellow fluorescence is totally covered by the yellow fluorescence emitted by the white LED. This kind of light pollution is due to face-to-face illumination, which may cause an optical capture device to fail in receiving an image, and thus is referred to as "face-to-face glare".

Someone may try to restore a polluted image to a normal one by using white balance as commonly used in cameras. However, in criminal investigation or biological research, such substantial adjustment for the contents of an image may change the image data itself. Thus, in court offence and defense or in research publication, the credibility of the image data may be challenged, thus leading to an adverse consequence.

In view of the foregoing, there is a need to provide a low-glare fluorescent-powder LED light device, which can be cooperated with an imaging device and does not produce fluorescence when the phosphor or fluorescent powder thereof is illuminated by a high-frequency LED, so that the signal/noise ratio can be increased, and true images can be obtained.

SUMMARY OF THE INVENTION

One object of the present invention is to provide a low-glare fluorescent-powder LED light device, wherein the central light beams emitting from a high-frequency directional light source thereof do not reach the fluorescent-powder LEDs, so that the fluorescence interference of the fluorescent-powder LEDs can be avoided. Thus, the credibility of an image obtained through the high-frequency directional light source can be increased.

Another object of the present invention is to provide a low-glare fluorescent-powder LED light device, which may employ the fluorescent-powder LEDs or high-frequency LEDs thereof to illuminate a target to obtain an image. Both images respectively by using the fluorescent-powder LEDs and the high-frequency LEDs can be compared with each other to confirm the validity of the images.

A further object of the present invention is to provide a low-glare fluorescent-powder LED light device, wherein the high-frequency LEDs thereof are arranged in radial symmetry, so that a target can be illuminated with more scattering light from the high-frequency LEDs, and thus the target can be observed more easily.

A still further object of the present invention is to provide an imaging device, which includes a low-glare fluorescent-powder LED light device and a light receiving element. The fluorescent-powder LED light device includes a shell connectable with the light receiving element, so that the image of a target can be captured more accurately, and the target can be observed more easily.

The low-glare fluorescent-powder LED light device of the present invention generally comprises a shell, a multi-frequency directional light source, a high-frequency directional light source, and at least one electrical control circuit. The shell has a surrounding wall, which defines a front opening and a rear opening at two opposite ends and has an inner surface extending along a central axis passing through the front opening and the rear opening. The multi-frequency directional light source includes at least one fluorescent-powder LED, which includes a substrate chip and a fluorescent powder layer, wherein the substrate chip can emit an exciting light beam with an excitation frequency, while the fluorescent powder layer can absorb part of the exciting light beam to release an excited light beam that has a frequency lower than the excitation frequency of the exciting light beam. The multi-frequency directional light source is disposed at the inner surface of the shell such that a light-emitting axis of the fluorescent-powder LED is perpendicular to the inner surface of the shell. The high-frequency directional light source includes a plurality of high-frequency LEDs each having a light-emitting axis. The high-frequency directional light source is disposed at the inner surface of the shell such that the high-frequency LEDs are arranged in radial symmetry about the central axis, and the light-emitting axis of each high-frequency LED is perpendicular to the inner surface of the shell. Each of the high-frequency LEDs can emit a central light beam to excite a substance containing phosphorescent or fluorescent materials to emit phosphoresce or fluorescence. When the high-frequency LEDs are enabled, the central light beams of the high-frequency LEDs do not reach the fluorescent-powder LED. The electrical control circuit can drive the multi-frequency directional light source and/or the high-frequency directional light source.

Furthermore, the imaging device of the present invention is generally composed of the low-glare fluorescent-powder LED light device and the light receiving element. The low-glare fluorescent-powder LED light device generally comprises a shell, a multi-frequency directional light source, a high-frequency directional light source, and at least one electrical control circuit. The shell has a surrounding wall, which defines a front opening and a rear opening at two opposite ends and has an inner surface extending along a central axis passing through the front opening and the rear opening. The multi-frequency directional light source includes at least one fluorescent-powder LED, which includes a substrate chip and a fluorescent powder layer, wherein the substrate chip can emit an exciting light beam with an excitation frequency, while the fluorescent powder layer can absorb part of the exciting light beam to release an excited light beam that has a frequency lower than the excitation frequency of the exciting light beam. The multi-frequency directional light source is disposed at the inner surface of the shell such that a light-emitting axis of the fluorescent-powder LED is perpendicular to the inner surface of the shell. The high-frequency directional light source includes a plurality of high-frequency LEDs each having a light-emitting axis. The high-frequency directional light source is disposed at the inner surface of the shell such that the high-frequency LEDs are arranged in radial symmetry about the central axis, and the light-emitting axis of each high-frequency LED is perpendicular to the inner surface of the shell. Each of the high-frequency LEDs can emit a central light beam to excite a substance containing phosphorescent or fluorescent materials to emit phosphoresce or fluorescence. When the high-frequency LEDs are enabled, the central light beams of the high-frequency LEDs do not reach the fluorescent-powder LED. The electrical control circuit can drive the multi-frequency directional light source and/or the high-frequency directional light source.

Since the low-glare fluorescent-powder LED light device is designed such that, when the high-frequency directional light source is turned on, the central light beams emitting therefrom do not reach the fluorescent-powder LED, so that the fluorescence interference due to the fluorescent-powder LED subjected to the central light beams can be avoided. Furthermore, an image, which is obtained by the multi-frequency directional light source illuminating a target, can be compared with another image through the high-frequency directional light source to confirm the consistency of the images. Still furthermore, the radial symmetry design of the high-frequency directional light source allows the target to be illuminated with more scattering light. Therefore, true images without color deviation can be obtained.

BRIEF DESCRIPTION OF THE DRAWINGS

The foregoing and other features and advantages of illustrated embodiments of the present invention will be more readily apparent from the following detailed description, which proceeds with reference to the accompanying drawings.

DETAILED DESCRIPTION OF THE ILLUSTRATED EMBODIMENTS

The foregoing and other technical contents, features and advantages of the present invention will be illustrated in detail by way of exemplary embodiments with reference to the accompanying drawings. In the exemplary embodiments, same elements will be indicated by similar numerals or labels.

In the present invention, a low-glare fluorescent-powder LED (light-emitting diode) light device means a LED light device which can prevent a fluorescent-powder LED thereof from being illuminated by a high-frequency LED thereof by adjusting the direction of light beam emitting from the high-frequency LED or by using a structure to block the light beam, so that the fluorescent powders of the fluorescent-powder LED do not give out fluorescence under excitation of the light beam of the high-frequency LED, thus eliminating or reducing the fluorescent noise to obtain a correct color image.

In the present invention, a light receiving element can work with the low-glare fluorescent-powder LED light device to become an embodiment of an imaging device. The light receiving element is referred to as an image capture unit, such as a camera. Of course, those skilled in the art can easily understand that other forms of light receiving element, such as microscopes, ophthalmoscopes or video devices, can work well with the low-glare fluorescent-powder LED light device.

Figure 1:
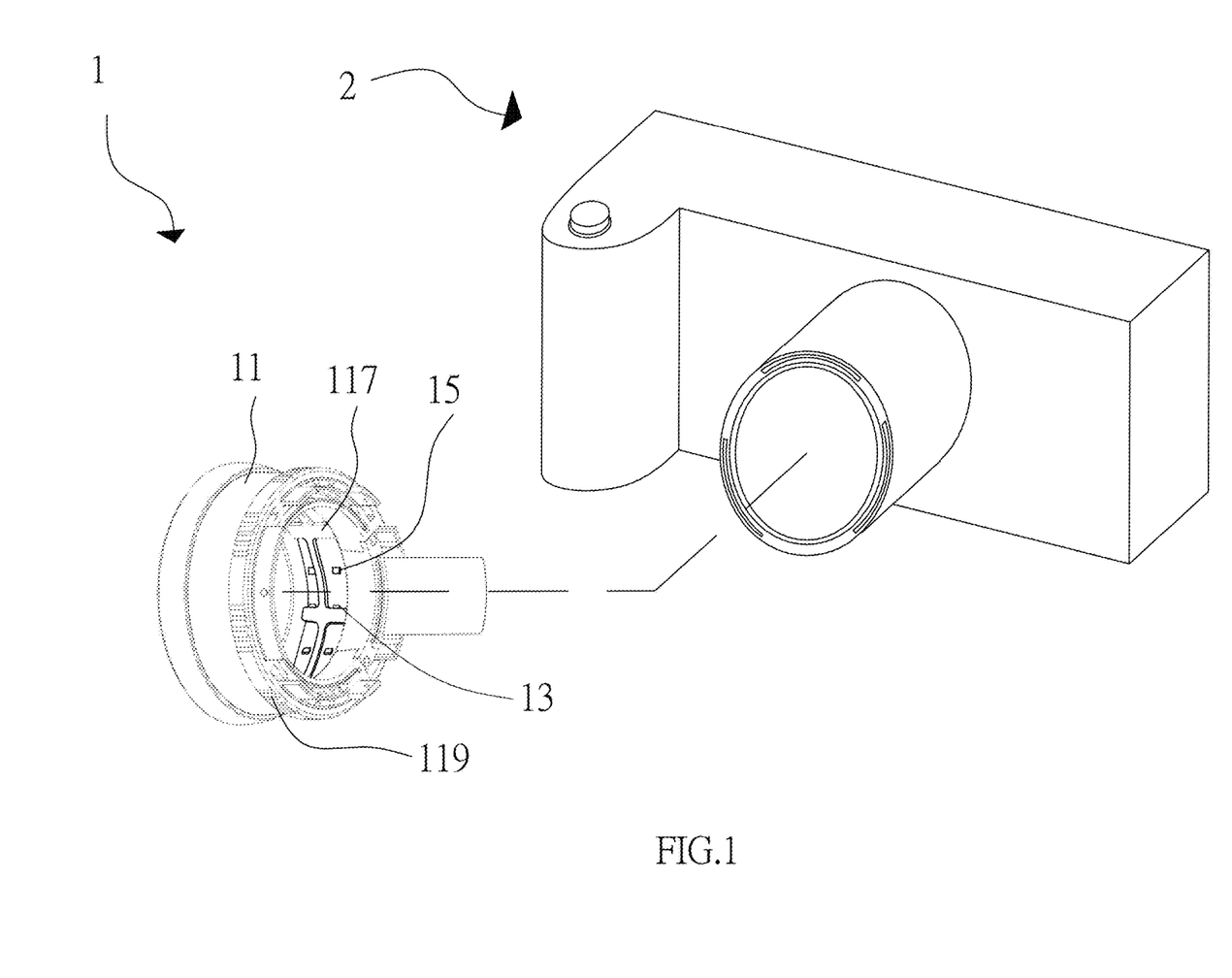
FIG. 1 shows a 3-dimensional view of a low-glare fluorescent-powder LED light device according to a first embodiment of the present invention.
Figure 2:
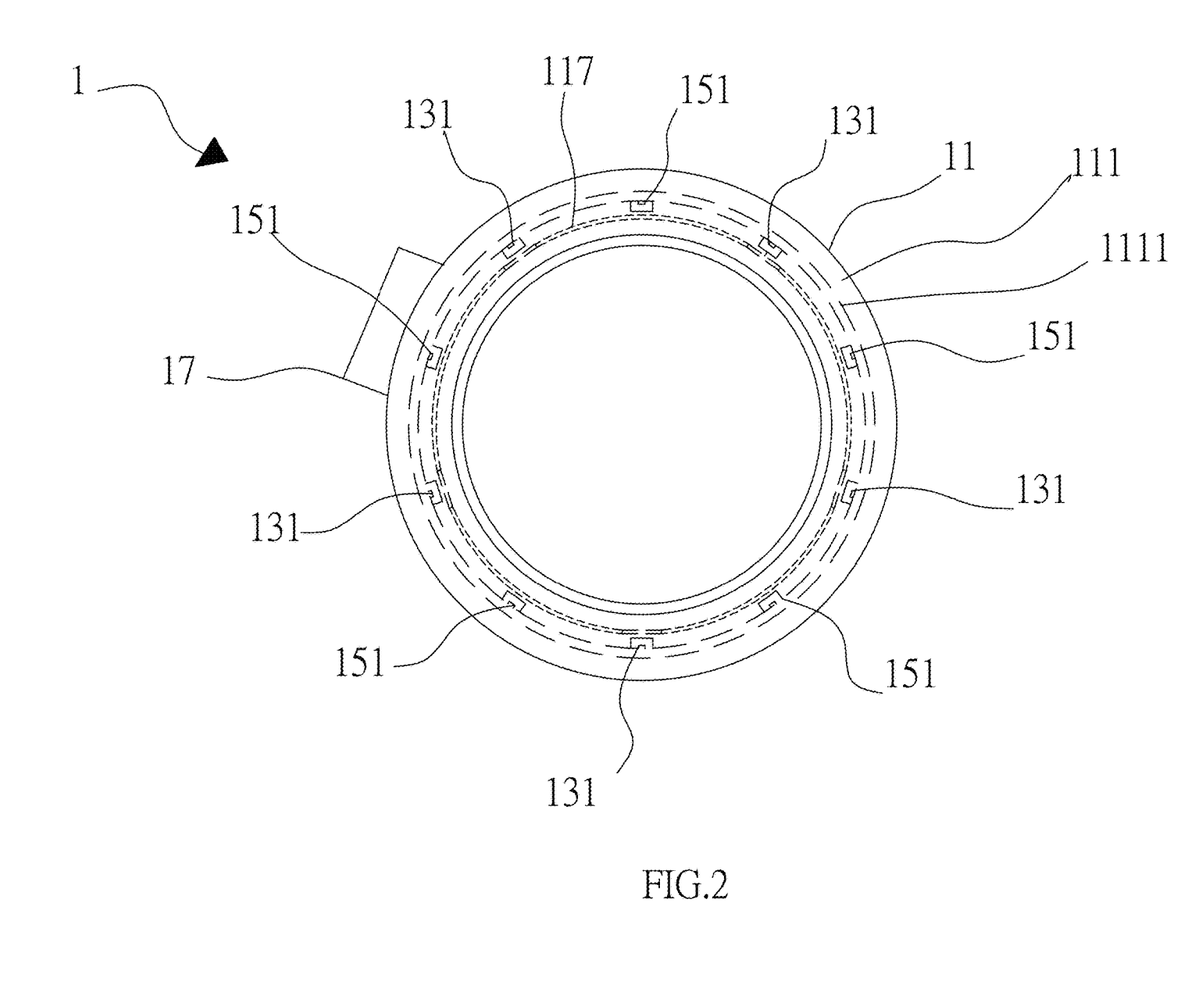
FIG. 2 shows a front view of the low-glare fluorescent-powder LED light device of the first embodiment, wherein the high-frequency LEDs are arranged in radial symmetry.
Figure 3:
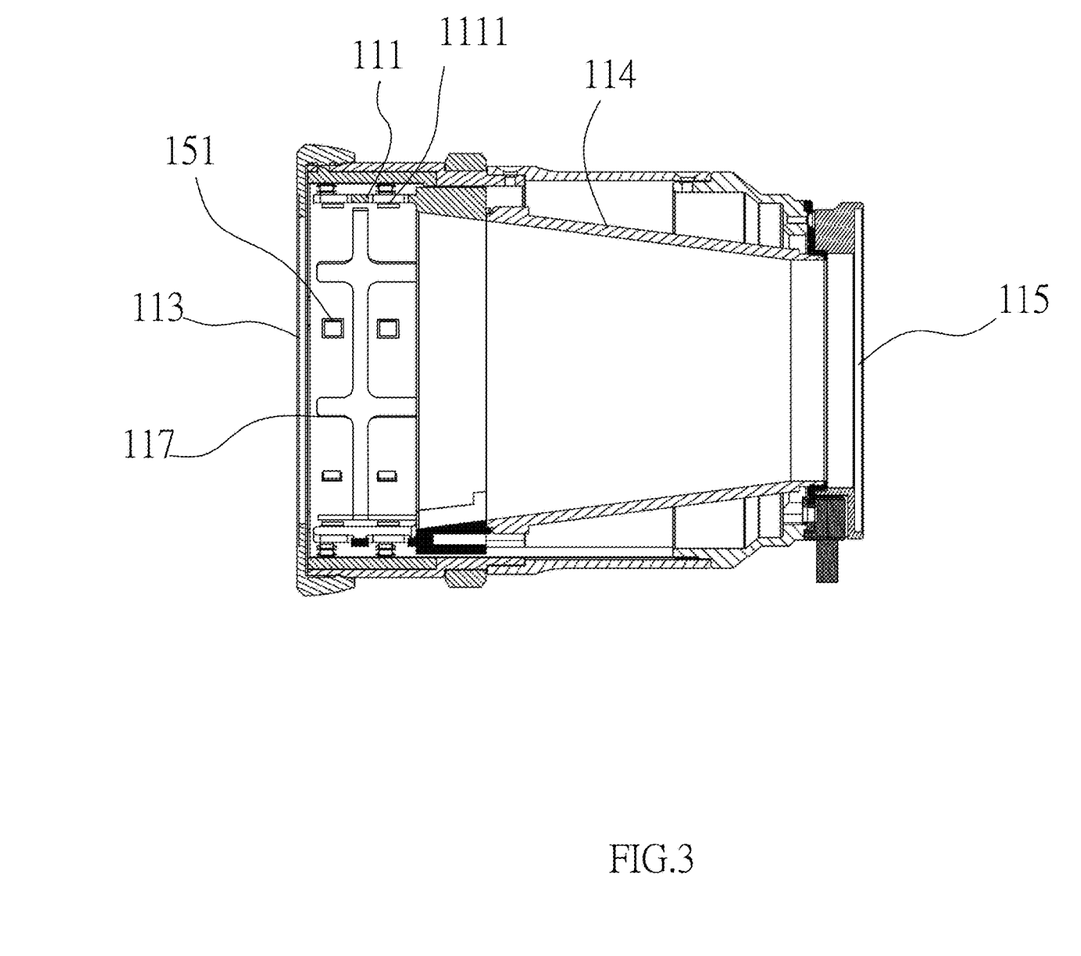
FIG. 3 shows a sectional view of the low-glare fluorescent-powder LED light device of the first embodiment, wherein the inner surface and the light intercepting wall are manifested.

Referring to FIGS. 1 through 3, a low-glare fluorescent-powder LED light device according to a first embodiment of the present invention is shown, which generally comprises a cylindrical shell 11, two multi-frequency directional light sources 13, two high-frequency directional light sources 15, and an electrical control circuit 17. In this embodiment, each multi-frequency directional light source includes five fluorescent-powder LEDs 131, wherein each LED is formed into a white LED package, which employs sapphire as a substrate. The substrate chip can emit blue light when the LED is enabled. The blue light can illuminate the red and green phosphors or fluorescent powders in front of the substrate chip to respectively emit red light and green light, each of which has a frequency lower than the blue light and is referred to as an excited light beam. As such, the spectrum of light emitting from each fluorescent-powder LED includes red, green and blue light, which recombines to form white light for illumination. For this reason, the fluorescent-powder LEDs 131 are termed as a multi-frequency directional light source.

In this embodiment, each high-frequency directional light source 15 includes five high-frequency LEDs 151, each of which is interpreted as a UV LED (ultraviolet light-emitting diode). Each of the high-frequency LEDs 151 is not provided with phosphors or fluorescent powders. The substrate chip of each high-frequency LED emits UV light, which has a frequency higher than visible light and contains photon energy sufficient to excite the red and green phosphors or fluorescent powders contained in the fluorescent-powder LEDs 131. The shell 11 has a surrounding wall 111 which defines two openings at two opposite ends thereof; for ease of illustration, the two openings are respectively termed as front opening 113 and rear opening 115. The fluorescent-powder LEDs 131 of each multi-frequency directional light source 13 are located at an inner surface 1111 of the surrounding wall 111 and arranged in radial symmetry about a central axis that passes through the front opening 113 and the rear opening 115. Also, the high-frequency LEDs 151 of each high-frequency directional light source 15 are located at the inner surface 1111 and arranged in radial symmetry about the central axis that passes through the front opening 113 and the rear opening 115. In this embodiment, the inner surface 1111 is configured as a cylindrical surface. In other embodiments, the inner surface 1111 may be configured as multiple rectangular faces. The inner surface 1111 is a surface or face, on which the high-frequency LEDs 151 or the fluorescent-powder LEDs 131 can be located, wherein the light-emitting axis of each LED is perpendicular to a corresponding surface or face, and thus the light beam emitting from each high-frequency LED 151 may reach one fluorescent-powder LED 131 located opposite thereto.

In a forensic examination, an investigator may first use white LEDs to illuminate a crime scene to record an image under visible light. Next, the white LEDs can be turned off, and UV LEDs can be turned on to illuminate a trace of saliva or semen. The UV light allows the flavin contained in the dry physiological fluid to give out fluorescence. However, if a conventional device is employed for the examination, the red and green phosphors contained in the white LEDs can be excited by the UV light emitting from the UV LEDs to respectively issue red and green light, and this may significantly affect the image of the physiological fluid, and thus the signal/noise ratio of the image can be reduced significantly. Even worse, the image may be misinterpreted or invalidated in a court judgement.

Figure 4:
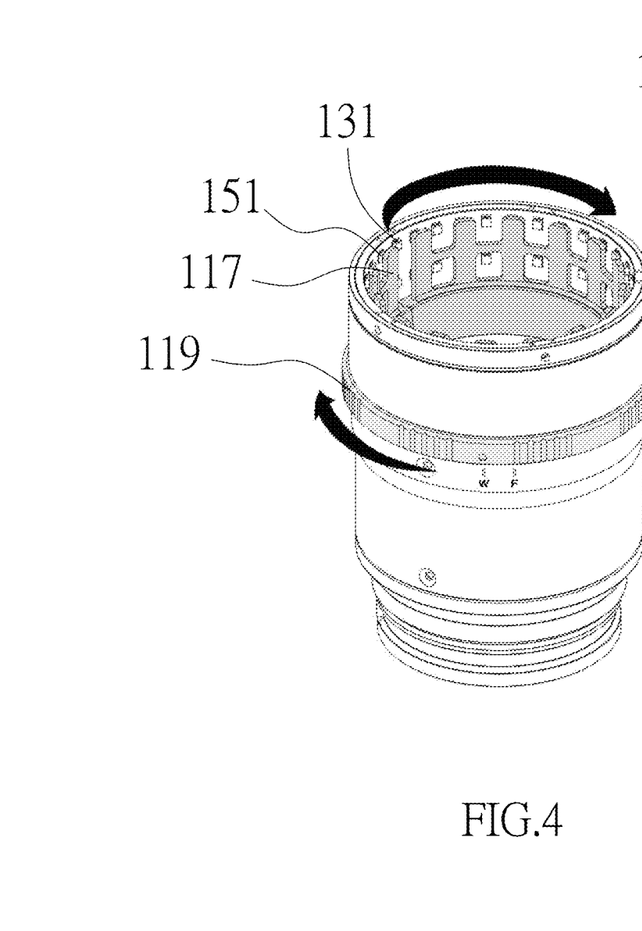
FIGS. 4 and 5 show 3-dimensional views of the first embodiment, which respectively shows two states of the shading plate.

To solve the problem of conventional devices, the shell 11 can be provided with a shading plate 117 and an actuation ring 119 which is formed together with the shading plate 117 and located outside of the shell 11. The shading plate 17 has a plurality of covering portions, wherein a gap is defined between two adjacent covering portions. Thus, in a forensic examination, when white LEDs are used to record an image, the investigator may turn the actuation ring 119 clockwise to have the gaps of the shading plate 117 aligned with the fluorescent-powder LEDs (i.e. white LEDs) 131, and simultaneously, the high-frequency LEDs 151 can be shaded by the covering portions of the shading plate 117. As such, when the fluorescent-powder LEDs 131 are enabled, the red and green light emitted by the phosphors of each LED 131 and the blue light emitted by the substrate chip of each LED 131 recombine to form a white light, which can travel along the light-emitting axis or path of the LED. It is noted that the white light does not directly pass through the front opening 113 of the shell 11. Since the white light undergoes multiple reflections to reach the front opening 113, scattering light can be given out of the front opening 113 of the shell 11 to illuminate an area desired to be observed. Furthermore, as shown in FIG. 1, a light receiving element 2 can work with the low-glare fluorescent-powder LED light device to obtain a clear image under white light.

Figure 5:
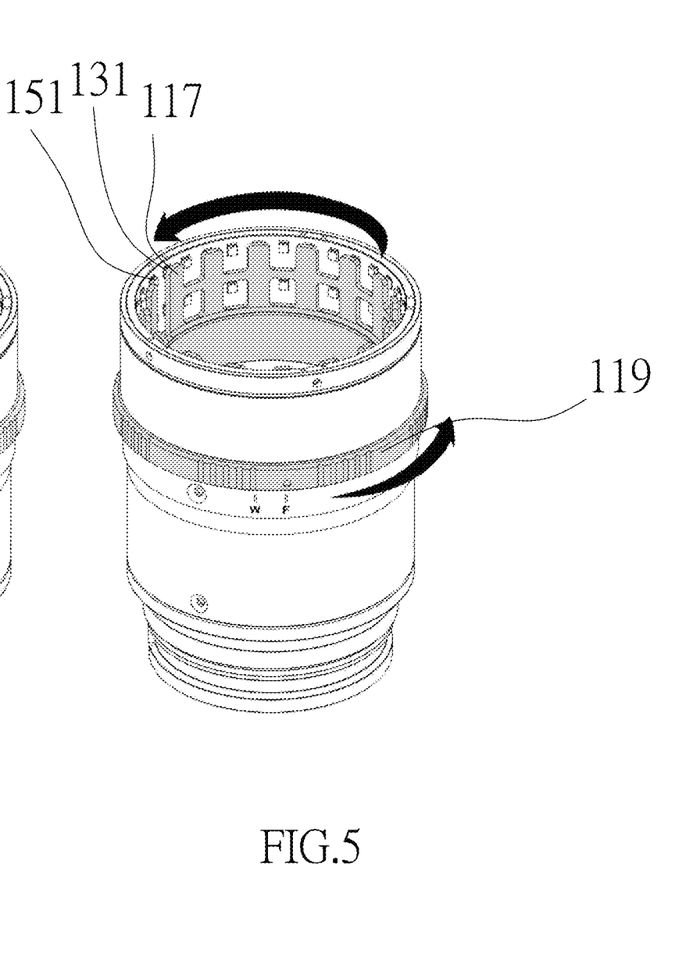

On the other hand, if an image formed by fluorescence is required, as shown in FIG. 5, the investigator may turn the actuation ring 119 counter-clockwise to have the covering portions of the shading plate 117 to shade the fluorescent-powder LEDs 131 (i.e. white LEDs), so that the light beams emitting from the high-frequency LEDs 151 can be blocked by the shading plate 117 and thus do not illuminate the fluorescent-powder LEDs 131. As such, the red and green phosphors contained in the LEDs 131 will not be excited. Thus, it is impossible that the red light and green light are released by the phosphors to interfere with an image formed by the fluorescence emitting from a dry physiological fluid at a criminal scene. Therefore, the signal/noise ratio of the fluorescence image can be increased, and the image can be compared with the one formed by white light. With the shading plate 117, a valid image required for a forensic investigation can be obtained.

Of course, those skilled in the art can understand that the shading plate 117 can be moved by turning the shell 11 or other means instead of turning the actuation ring 119 to shade the fluorescent-powder LEDs 131. Furthermore, as shown in FIG. 3, the shell 11 may further include a light intercepting wall 114 provided with black coating thereon and extending rearwardly from the surrounding wall 114, so that when the light beams emitting from the light sources 13, 15 are incident on the light intercepting wall 114, a large amount of light beams can be absorbed by the light intercepting wall 114 to prevent the reflective light beams from entering the light receiving element 2 behind the shell 11, thus reducing noise and preventing an image formed by fluorescence or white light from interference.

Figure 6:
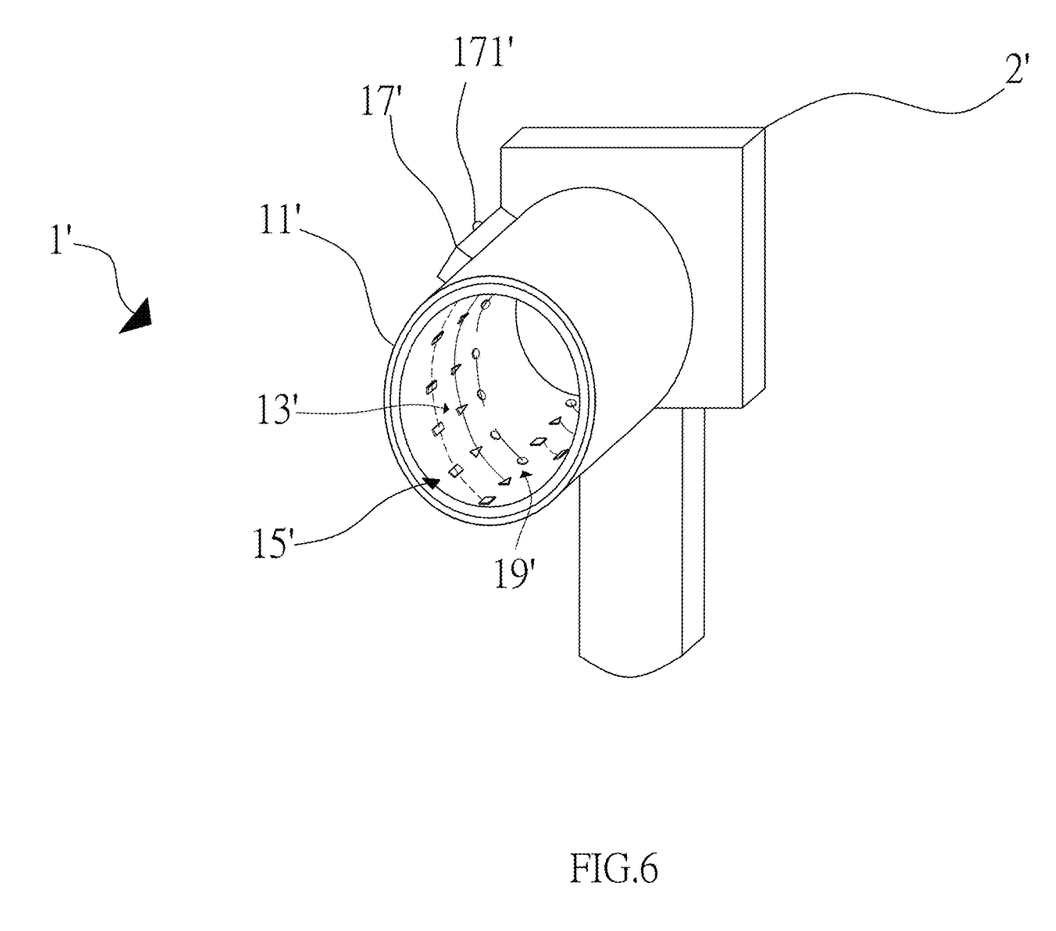
FIG. 6 shows a schematic view of a low-glare fluorescent-powder LED light device according to a second embodiment of the present invention, wherein the LED light device is worked with a ophthalmoscope for conducting a fundus examination.
Figure 7:
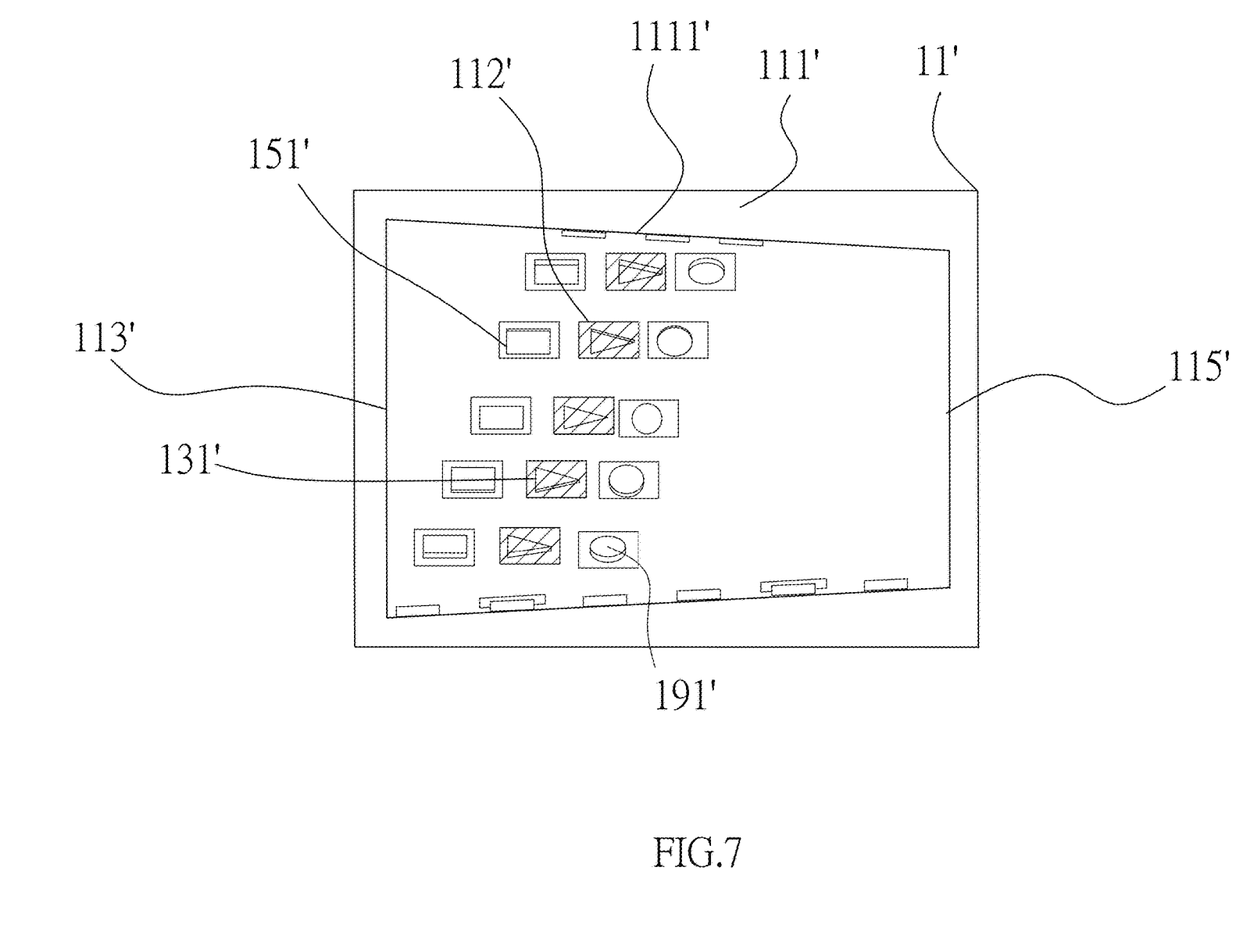
FIG. 7 shows a schematic sectional view of the low-glare fluorescent-powder LED light device of the second embodiment, wherein the interior arrangement of the LED light device is manifested.

FIGS. 6 and 7 show a second embodiment of the present invention, wherein a low-glare fluorescent-powder LED light device 1' is worked with a light receiving element 2', which is interpreted as an ophthalmoscope. As shown, the low-glare fluorescent-powder LED light 1' generally comprises a cylindrical shell 11', a multi-frequency directional light source 13', a high-frequency directional light source 15', and an electrical control circuit 17'. The multi-frequency directional light source 13 includes a plurality of fluorescent-powder LEDs 131', each of which is interpreted as a white LED composed of a blue-light substrate chip and a yellow phosphor or fluorescent powder. The high-frequency directional light source 15' includes a plurality of high-frequency LEDs 151'. In a fundus examination, some injections can be used, one of which is a fluorescent dye having an excitation wavelength about 490 nm, which is different from the central frequency (about 470 nm) of the commonly used blue LED. Thus, the high-frequency LED 151' includes a phosphor or fluorescent powder in addition to a blue-light substrate chip, wherein the blue-light substrate chip can emit blue light with a wavelength of about 470 nm, while the phosphor or fluorescent powder can absorb the blue light to emit green-blue light, which has a wavelength of 490 nm, to proceed with a fundus vascular examination.

For meeting a special requirement of fundus examination, the low-glare fluorescent-powder LED light device 1' may further comprise a low-frequency directional source 19' including a plurality of low-frequency LEDs 191', each of which does not contain phosphors or fluorescent-powders therein and can emit a light beam having a central wavelength within the spectrum of infrared light. Since infrared light cannot be detected by human eyes, when one eye is illuminated by infrared light, the eyes pupil does not shrink, and thus infrared light can pass through the pupil to take an image of the fundus without using a mydriatic agent. Therefore, the problem of pupil failing to return to its normal state due to using a mydriatic agent can be avoided. Furthermore, infrared light is insufficient in energy to excite the phosphors or fluorescent-powders contained in the multi-frequency LEDs. 131'. For easy of implementing this embodiment, the shading plate used in the first embodiment can be replaced by a liquid crystal element 112' for selectively shading the LEDs of the light sources, and the electrical control means 17' may include a controller 171' for driving the liquid crystal element 112' to selectively shade the LEDs of the light sources.

Similarly, in this embodiment, the shell 11' has a surrounding wall 111' that defines a front opening 113' and a rear opening 115' respectively at two opposite ends thereof, wherein a central axis (not shown) passes through the front opening 113' and the rear opening 115'. The surrounding wall 111' has an inner surface 1111'. Also, since the front opening 113' has a diameter slightly greater than the rear opening 115', the inner surface 1111' extends at an angle to the central axis. The multi-frequency directional light source 13', the high-frequency directional light source 15', and the low-frequency directional light source 19' are disposed such that the light-emitting axis of each LED is perpendicular to the inner surface 1111', and the LEDs of each light source on the inner surface 1111' are arranged around the central axis in a helical manner. The LEDs of each light source are arranged at equal-angle intervals and in radial symmetry about the central axis so that scattering light can be created in the shell and sent out to an area where a target is located.

Although the light-emitting axis of each high-frequency LED 151' is not directly aimed at a corresponding fluorescent-powder LED 131', each fluorescent-powder LED 131' is in the illuminating range of one high-frequency LED 151'. To prevent the phosphors of the fluorescent-powder LEDs 131' from being excited by the high-frequency LEDs 151' to release yellow fluorescence, the liquid crystal element 112' can be used to shade the fluorescent-powder LEDs 131'. The controller 171' can drive the liquid crystal element 112' to close portions corresponding to the fluorescent-powder LEDs 131', thus shading the fluorescent-powder LEDs 131'. Therefore, the light beams emitting from the high-frequency LEDs 151' can be blocked. As to the low-frequency LEDs 191', since the light beams emitting therefrom is insufficient in energy to excite phosphors or fluorescent powders, there is no need to control the liquid crystal element 112' to shade the LEDs 191'.

When conducting ophthalmic angiography, a dose of diagnogreen can be first injected into the cubitus vein. After the substance being carried into the blood vessels at the fundus, illuminsion of the high-frequency LEDs 151' can excite the substance to emit fluorescence. By using the liquid crystal element 112' to shade the fluorescent-powder LED 131', an image formed by the released fluorescence can be clearly detected by the ophthalmoscope and shown on a display screen. On the other hand, when a fundus scan and photography without using a mydriatic agent is required, the low-frequency LEDs 191' can be enabled to emit near infrared light for the ophthalmoscope. Since near infrared light cannot be detected by human eyes, the pupil can be prevented from shrink and thus a mydriatic agent is not required. In addition, a doctor may use the fluorescent-powder LED 131' (i.e. white LED) to emit white light to directly observe the fundus, and the mage of the fundus can be shown on a display screen. The images formed by different types of light can be compared with each other, so that the fundus can be diagnosed more accurately.

Figure 8:
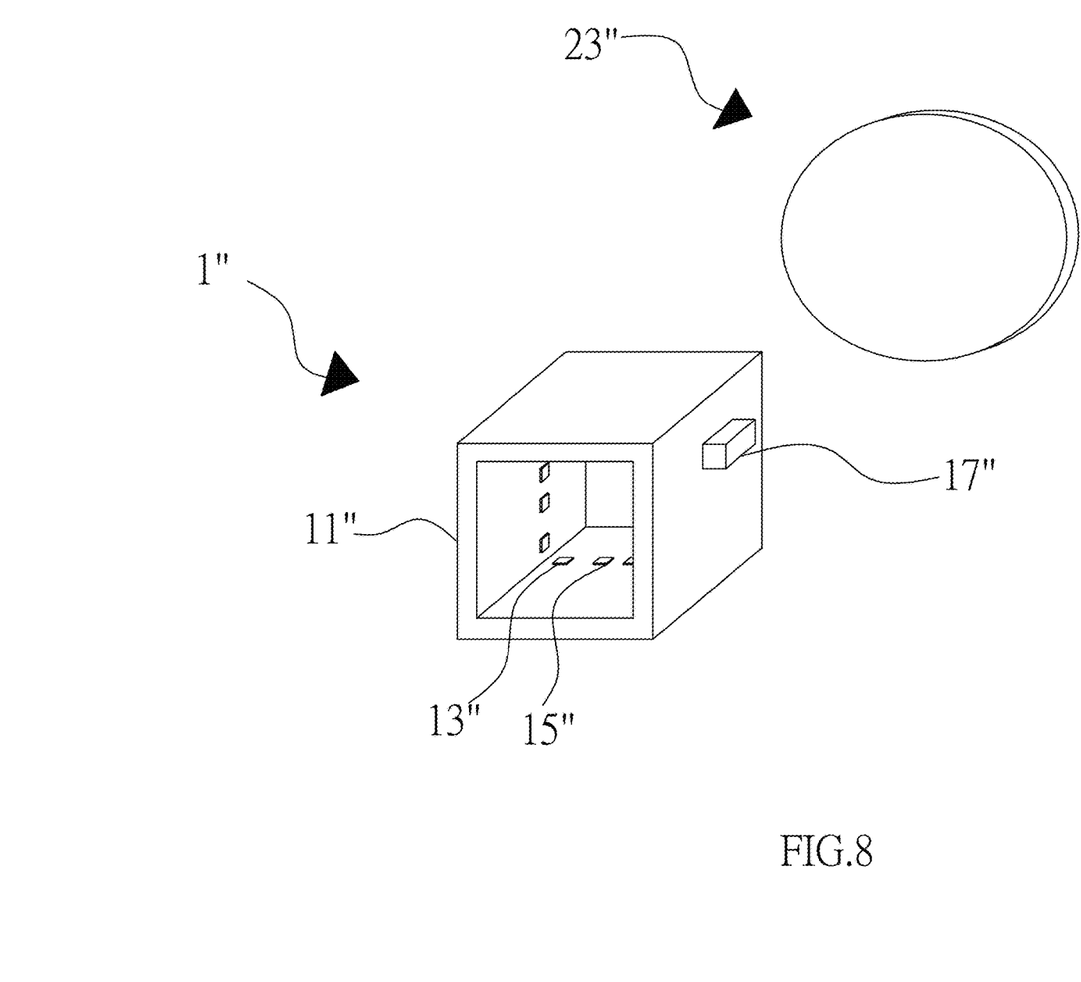
FIG. 8 shows a schematic view of a low-glare fluorescent-powder LED light device according to a third embodiment of the present invention.
Figure 9:
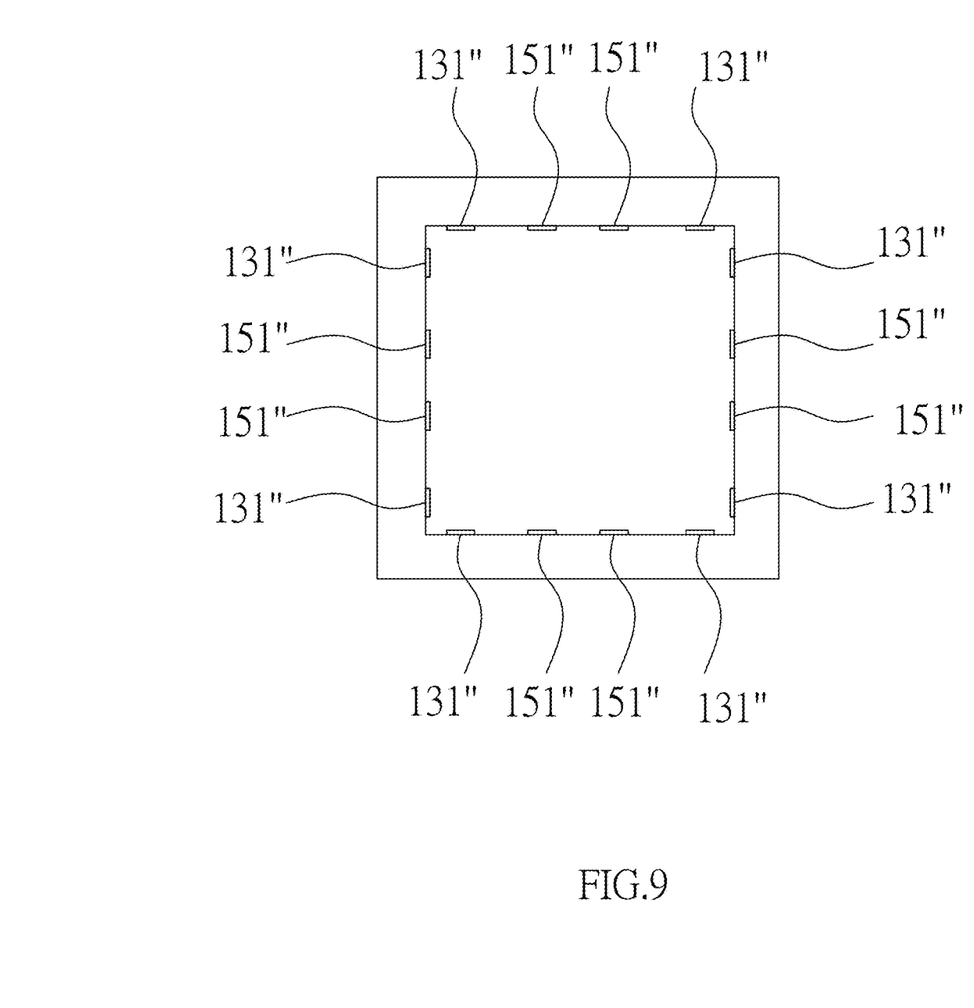
FIG. 9 shows a front view of the low-glare fluorescent-powder LED light device of the third embodiment, wherein the high-frequency LEDs are arranged in radial symmetry.
Figure 10:
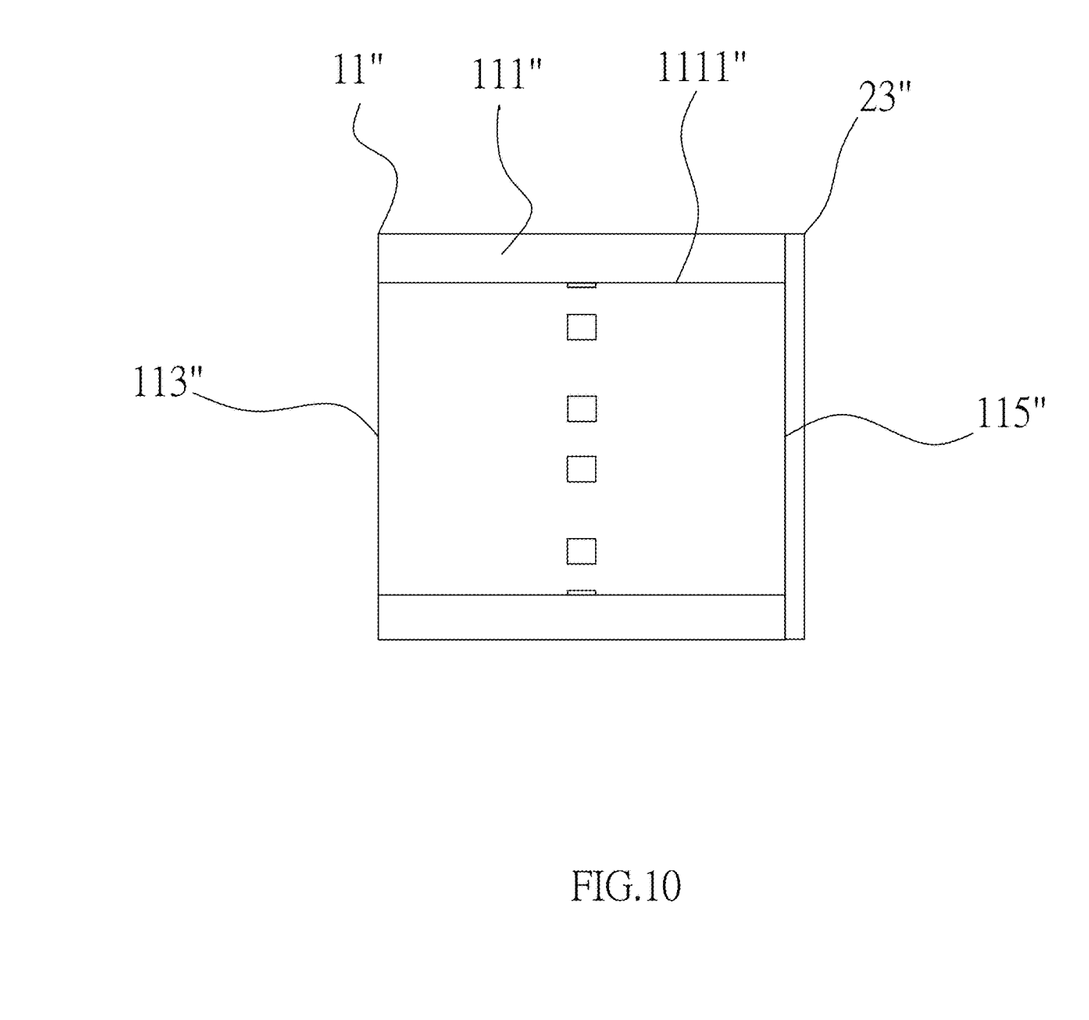
FIG. 10 shows a sectional view of the low-glare fluorescent-powder LED light device of the third embodiment, wherein the interior arrangement of the LED light device is manifested.

Recently, transgenic technology prevails in biological science researches. Since a transgene at a particular segment of a DNA sequence can be inserted with fluorescent protein gene, after the transgene being introduced to an organism, such as white mice, rabbits or zebrafishes, to confirm whether the transgene is successfully introduced to the organism, a high-frequency light source can be used to illuminate the organism. If fluorescence is detected, then a successful introduction of the transgene can be confirmed. FIG. 8 through 10 show a third embodiment of the present invention, wherein the low-glare fluorescent-powder LED light device 1" generally comprises a cubic shell 11", a multi-frequency directional light source 13", a high-frequency directional light source 15", and an electrical control circuit 17".

In this embodiment, the multi-frequency directional light source 13" includes 8 fluorescent-powder LEDs 131", each of which is interpreted as a white LED. The high-frequency directional light source 15" includes 8 high-frequency LED 151", each of which is interpreted as a UV OLED (ultraviolet organic light-emitting diode).

The cubic shell 11" has a surrounding wall 111" that defines a front opening 113" and a rear opening 115" respectively at two opposite ends thereof, wherein a central axis (not shown) passes through the front opening 113" and the rear opening 115". A white mouse can be placed into the cubic shell 11" via the front opening 113", and then the front opening 113" can be placed in contact with a desk, on which the white mouse is located. The rear opening 115" can be covered with a filter 23", through which the white mouse in the shell 11" can be observed. The multi-frequency directional light source 13" and the high-frequency directional light source 15" are located at the inner surface 1111" of the surrounding wall 111", which has four anti-reflective faces, wherein the light-emitting axis of each LED is perpendicular to the inner surface 1111", and the LEDs 131", 151" are interleaved and arranged in radial symmetry about the central axis. As such, a target, such as the white mouse, can be illuminated with more scattering light.

In this embodiment, the fluorescent-powder LEDs 131" are arranged in a face-to-face manner and at an offset from the high-frequency LEDs 151", so that the fluorescent-powder LEDs 131" (i.e. white LEDs) are not subjected to the light beams emitting from the high-frequency LEDs 151". Therefore, the phosphors or fluorescent-powders contained in the LEDs 131 will not be excited by the light beams to emit fluorescence, and thus an observation for a target can be conducted more smoothly. On the other hand, the rear opening 115" can be covered with a filter 23", which only allows the fluorescence emitted by the fluorescent protein contained in a target to pass through. Therefore, the image formed by the fluorescence of the target (such as the white mouse) can be clearer. Also, the fluorescence image can be compared with the image formed by using the white LEDs.

Figure 11:
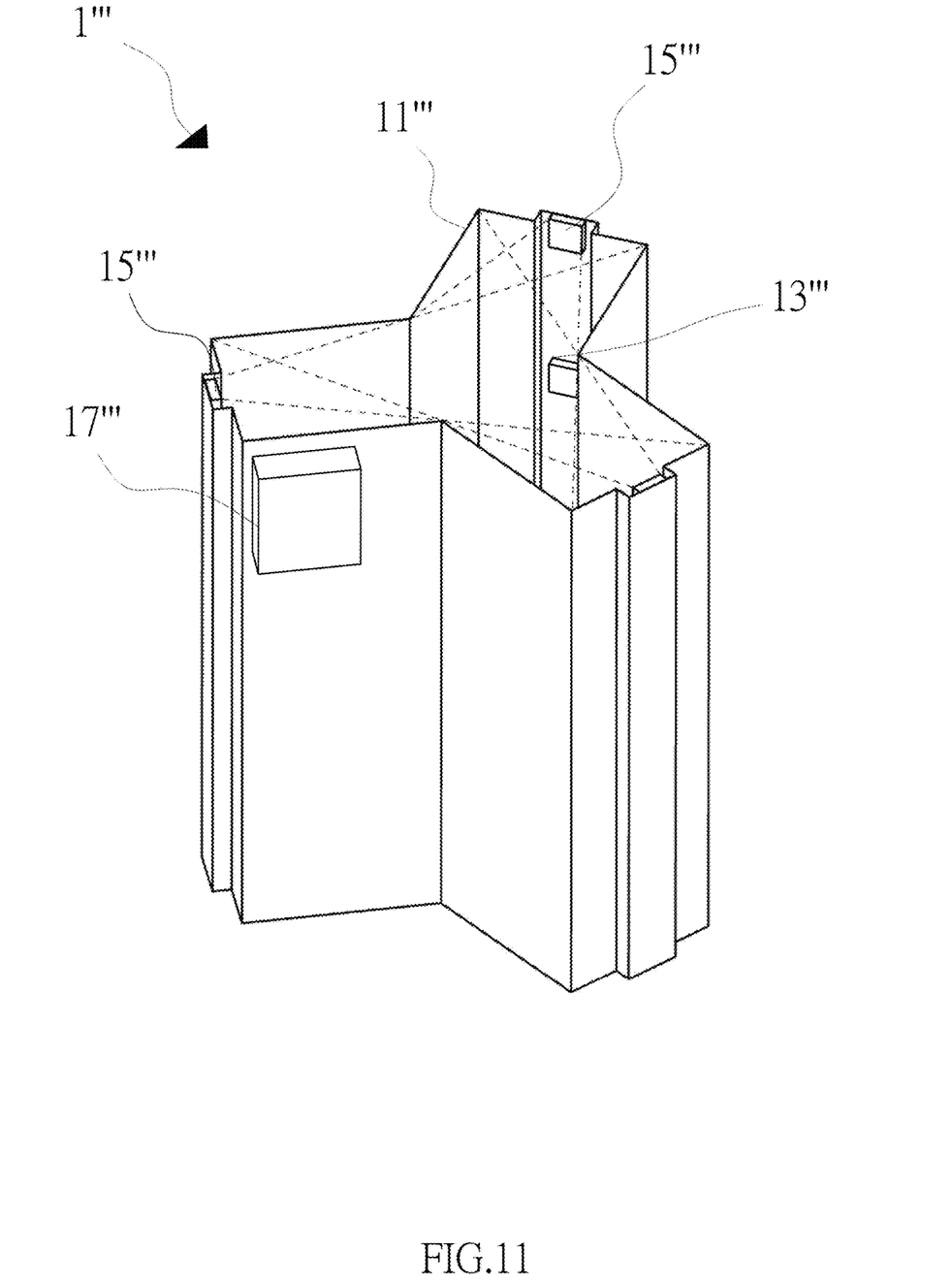
FIG. 11 shows a schematic view of a low-glare fluorescent-powder LED light device according to a fourth embodiment of the present invention.
Figure 12:
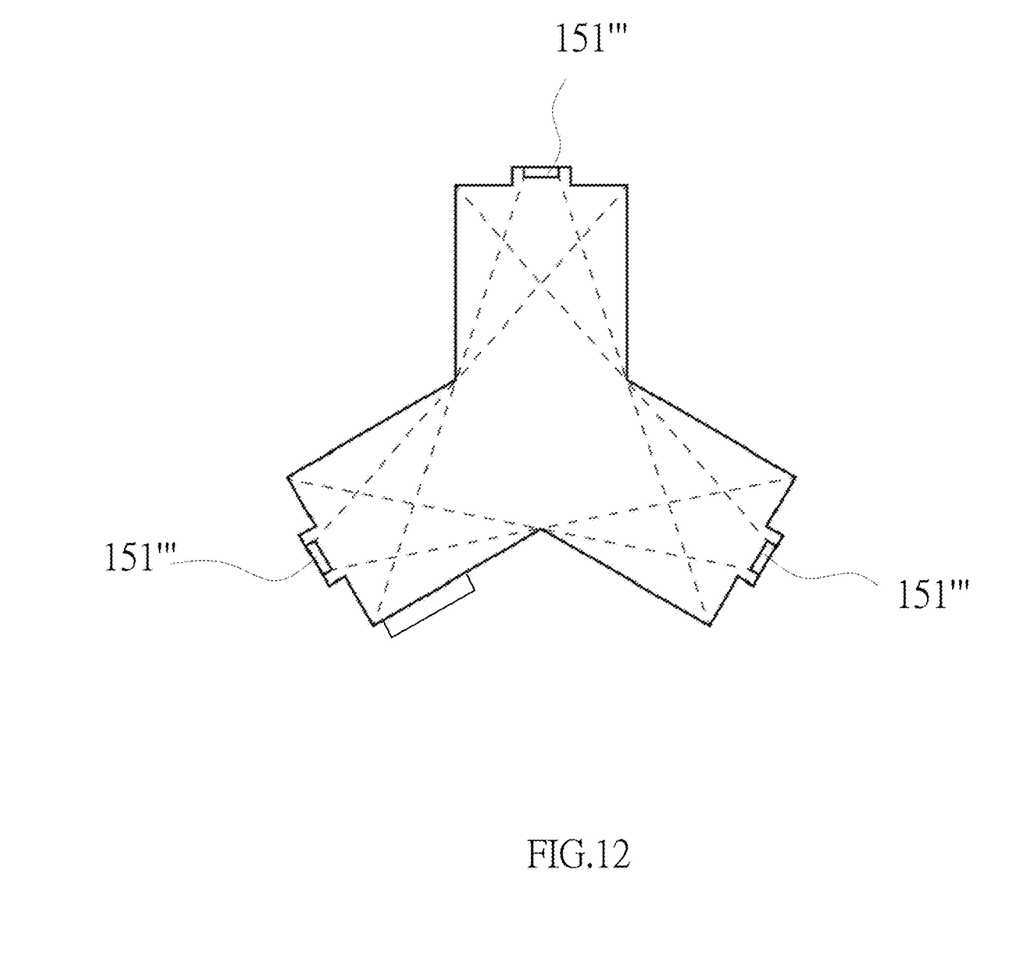
FIG. 12 shows a front view of the low-glare fluorescent-powder LED light device of the fourth embodiment, wherein the high-frequency LEDs are arranged in radial symmetry.
Figure 13:
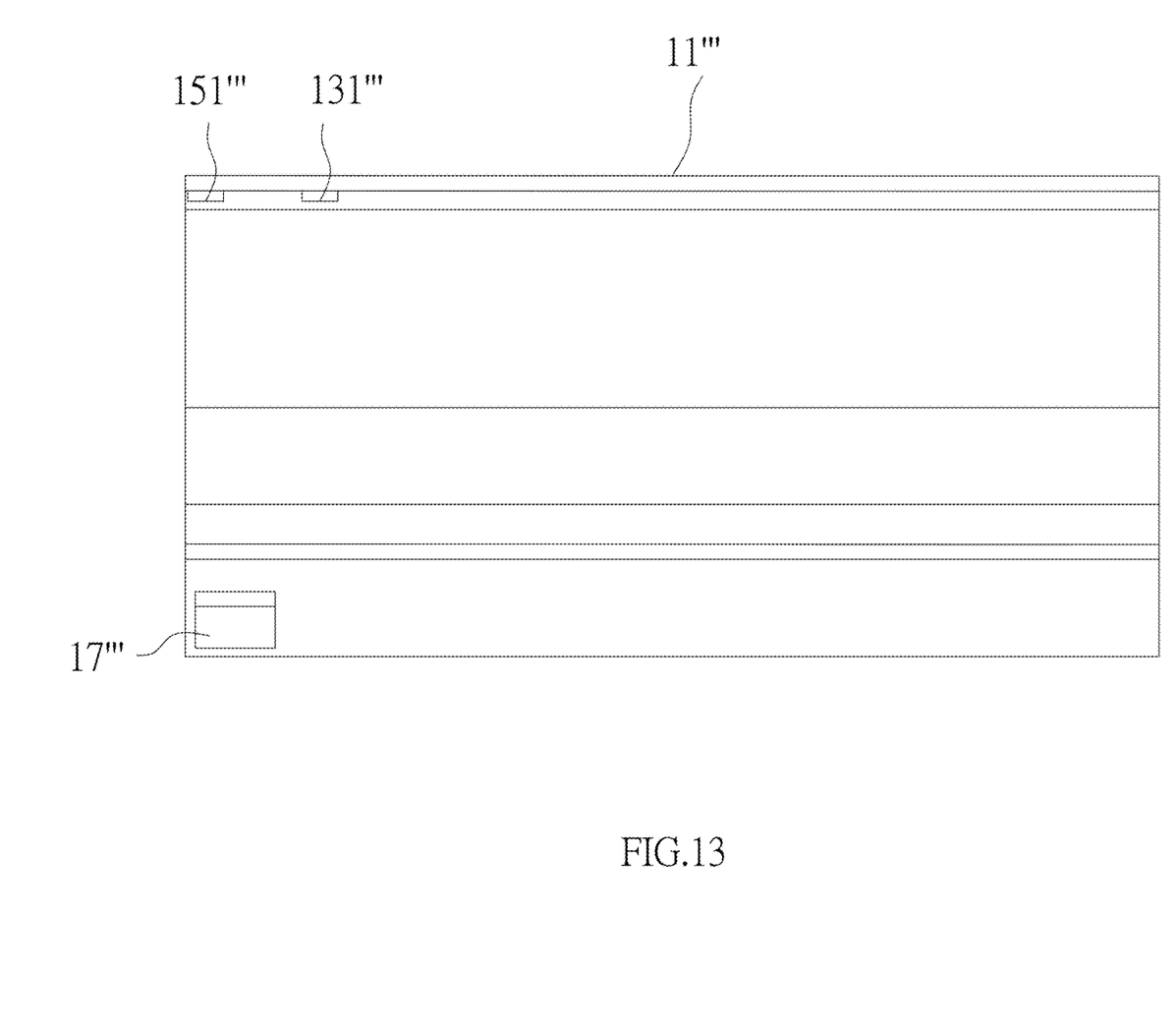
FIG. 13 shows a sectional view of the low-glare fluorescent-powder LED light device of the fourth embodiment, wherein the interior arrangement of the LED light device is manifested.

FIGS. 11 through 13 show a fourth embodiment of the present invention, wherein the low-glare fluorescent-powder LED light device 1''' generally comprises a three-leaved shell 11''', a multi-frequency directional light source 13''', a high-frequency directional light source 15''', and an electrical control circuit 17'''.

In this embodiment, the multi-frequency directional light source 13''' includes three fluorescent-powder LEDs 131'''. The high-frequency directional light source 15''' includes 3 high-frequency LEDs 151''', each of which is interpreted as a blue QLED (quantum dot light-emitting diode). Each of the high-frequency LEDs 151''' is located at a distal end of one leaf, which is away from a central axis (not shown) that passes through a front opening and a rear opening of the shell 11'''. The fluorescent-powder LEDs 131''' are placed below the high-frequency LEDs 151'''.

The root portion of each leaf of the shell 11''' can block the light beam of a high-frequency LED 151' located in the leaf from reaching the fluorescent-powder LEDs 131''' located in other leaves, thus increasing the signal/noise ratio and improving the quality of the capture image.

In the above embodiments, the light sources, the shell shape, and the shell interior design can be changed according to an application. Generally, the front opening of the shell is located close to a target desired to be observed, while the rear opening of the shell is away from the target; however, the rear opening can be located close to a target according to an application. Although some light emitting elements may be too bulky to be in full contact with the inner surface of the shell, the elements can be employed in the present invention as well if they can be fixed properly. Also, any types of light emitting elements, such as high-frequency LEDs without phosphors, high-frequency with phosphors, OLED, or QLED, or other similar elements can be employed in the present invention.

While the invention has been described with reference to the preferred embodiments above, it should be recognized that the preferred embodiments are given for the purpose of illustration only and are not intended to limit the scope of the present invention and that various modifications and changes, which will be apparent to those skilled in the relevant art, may be made without departing from the scope of the invention.

What is claimed is:

1. A fluorescent-powder LED light device, comprising:
   a shell having a surrounding wall that defines a front opening and a rear opening at two opposite ends and has an inner surface extending along a central axis passing through the front opening and the rear opening;
   a multi-frequency directional light source including at least one fluorescent-powder LED that includes a substrate chip and a fluorescent powder layer, the substrate chip capable of emitting an exciting light beam with an excitation frequency, the fluorescent powder layer capable of absorbing part of the exciting light beam to release an excited light beam that has a frequency lower than the excitation frequency of the exciting light beam, the multi-frequency directional light source being disposed at the inner surface of the shell such that a light-emitting axis of the fluorescent-powder LED is perpendicular to the inner surface of the shell;

a high-frequency directional light source including a plurality of high-frequency LEDs each having a light-emitting axis, the high-frequency directional light source being disposed at the inner surface of the shell such that the high-frequency LEDs are arranged in radial symmetry about the central axis, and the light-emitting axis of each high-frequency LED is perpendicular to the inner surface of the shell, each high-frequency LED capable of emitting a central light beam to excite a substance containing phosphorescent or fluorescent materials to emit fluorescence; wherein when the high-frequency LEDs are enabled, the central light beams of the high-frequency LEDs do not reach the fluorescent-powder LED; and at least one electrical control circuit for driving the multi-frequency directional light source and/or the high-frequency directional light source;

wherein the shell is provided with a shading means for shading the fluorescent-powder LED from the light beams of the high-frequency LEDs when being enabled, the shading means is a shading plate, and the shell is provided at its outer surface with an actuation ring for operating the shading plate.

2. The fluorescent-powder LED light device of claim 1, further comprising at least one low-frequency directional light source disposed at the inner surface of the shell, the low-frequency directional light source including a plurality of low-frequency LEDs, each of which has a light-emitting axis and does not contain fluorescent powders, the low-frequency LEDs being arranged in radial symmetry about the central axis, such that the light-emitting axis of each low-frequency LED is perpendicular to the inner surface of the shell, each of the low-frequency LEDs emitting a central light beam with a frequency, which is incapable of exciting the fluorescent powder layer of the fluorescent-powder LED to release the excited light beam.

3. The fluorescent-powder LED light device of claim 1, wherein the shell further includes a light intercepting wall which extends from the surrounding wall thereof.

4. A fluorescent-powder LED light device, comprising:

a shell having a surrounding wall that defines a front opening and a rear opening at two opposite ends and has an inner surface extending along a central axis passing through the front opening and the rear opening;

a multi-frequency directional light source including at least one fluorescent-powder LED that includes a substrate chip and a fluorescent powder layer, the substrate chip capable of emitting an exciting light beam with an excitation frequency, the fluorescent powder layer capable of absorbing part of the exciting light beam to release an excited light beam that has a frequency lower than the excitation frequency of the exciting light beam, the multi-frequency directional light source being disposed at the inner surface of the shell such that a light-emitting axis of the fluorescent-powder LED is perpendicular to the inner surface of the shell;

a high-frequency directional light source including a plurality of high-frequency LEDs each having a light-emitting axis, the high-frequency directional light source being disposed at the inner surface of the shell such that the high-frequency LEDs are arranged in radial symmetry about the central axis, and the light-emitting axis of each high-frequency LED is perpendicular to the inner surface of the shell, each high-frequency LED capable of emitting a central light beam to excite a substance containing phosphorescent or fluorescent materials to emit fluorescence; wherein when the high-frequency LEDs are enabled, the central light beams of the high-frequency LEDs do not reach the fluorescent-powder LED; and at least one electrical control circuit for driving the multi-frequency directional light source and/or the high-frequency directional light source;

wherein the shell is provided with a shading means for shading the fluorescent-powder LED from the light beams of the high-frequency LEDs when being enabled, the shading means is a liquid crystal element, and the electrical control circuit includes a controller for driving the liquid crystal element to selectively shade the LEDs of the light sources.

5. The fluorescent-powder LED light device of claim 4, further comprising at least one low-frequency directional light source disposed at the inner surface of the shell, the low-frequency directional light source including a plurality of low-frequency LEDs, each of which has a light-emitting axis and does not contain fluorescent powders, the low-frequency LEDs being arranged in radial symmetry about the central axis, such that the light-emitting axis of each low-frequency LED is perpendicular to the inner surface of the shell, each of the low-frequency LEDs emitting a central light beam with a frequency, which is incapable of exciting the fluorescent powder layer of the fluorescent-powder LED to release the excited light beam.

6. The fluorescent-powder LED light device of claim 4, wherein the shell further includes a light intercepting wall which extends from the surrounding wall thereof.

* * * * *